United States Patent
Liu et al.

(10) Patent No.: US 10,833,118 B2
(45) Date of Patent: Nov. 10, 2020

(54) CHIP PACKAGE AND MANUFACTURING METHOD THEREOF

(71) Applicant: XINTEC INC., Taoyuan (TW)

(72) Inventors: Tsang-Yu Liu, Zhubei (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/001,065

(22) Filed: Jan. 19, 2016

(65) Prior Publication Data
US 2016/0211297 A1 Jul. 21, 2016

Related U.S. Application Data

(60) Provisional application No. 62/106,051, filed on Jan. 21, 2015.

(51) Int. Cl.
*H01L 27/146* (2006.01)

(52) U.S. Cl.
CPC .. *H01L 27/14636* (2013.01); *H01L 27/14618* (2013.01); *H01L 27/14687* (2013.01); *H01L 2224/11* (2013.01)

(58) Field of Classification Search
CPC ......... H01L 27/14636; H01L 27/14687; H01L 27/14618; H01L 257/773; H01L 2224/1405; H01L 2224/141; H01L 2224/1605; H01L 2224/161; H01L 2224/2505; H01L 2224/251; H01L 2224/2901; H01L 2224/2902; H01L 2224/3005
See application file for complete search history.

(56) References Cited

U.S. PATENT DOCUMENTS

| | | | | |
|---|---|---|---|---|
| 2009/0289345 A1* | 11/2009 | Tsai | .................. | H01L 21/76898 257/690 |
| 2012/0161163 A1* | 6/2012 | Kim | .................... | H01L 25/0753 257/88 |
| 2014/0319670 A1 | 10/2014 | Chien et al. | | |
| 2015/0041995 A1* | 2/2015 | Lin | .................... | H01L 21/76898 257/782 |
| 2016/0163755 A1* | 6/2016 | Huang | ............... | H01L 27/14636 257/459 |

FOREIGN PATENT DOCUMENTS

| | | |
|---|---|---|
| CN | 103107153 | 5/2013 |
| CN | 103545295 | 1/2014 |
| TW | 201405676 | 2/2014 |

* cited by examiner

*Primary Examiner* — Julio J Maldonado
*Assistant Examiner* — Stanetta D Isaac
(74) *Attorney, Agent, or Firm* — Liu & Liu

(57) ABSTRACT

A manufacturing method of a chip package includes the following steps. A light transmissive substrate is bonded to a first surface of a wafer, such that a dam element between the light transmissive substrate and the wafer covers a conductive pad of the wafer. A second surface of the wafer facing away from the first surface is etched, such that a hollow region and a trench selectively communicated with the hollow region are synchronously formed in the wafer. A first isolation layer on the conductive pad is etched to expose the conductive pad through the hollow region.

17 Claims, 9 Drawing Sheets

CHIP PACKAGE AND MANUFACTURING METHOD THEREOF

RELATED APPLICATIONS

This application claims priority to U.S. provisional Application Ser. No. 62/106,051, filed Jan. 21, 2015, which is herein incorporated by reference.

BACKGROUND

Field of Invention

The present invention relates to a chip package and a manufacturing method of the chip package.

Description of Related Art

Generally, in manufacturing a chip package of an image sensor, a light transmissive substrate is disposed on a surface of a wafer, and a dam element is used to separate the light transmissive substrate and the wafer with a gap.

Thereafter, an etching process may be performed on the wafer to form a through silicon via (TSV), and then a conductive layer is formed on the wafer, such that the conductive layer may be connected to a conductive pad that is in the through silicon via. Subsequently, a cutter is utilized to cut the wafer and the light transmissive substrate in a vertical direction, thereby forming plural image sensors.

However, since the cutter dices the wafer and the light transmissive substrate, a region of the wafer for being cut by the cutter needs to be reserved. As a result, after the wafer and the light transmissive substrate are cut by the cutter, a distance between an edge of the wafer formed by cutting and the through silicon via is large, and it is difficult to reduce the packaging volume of the chip package, and the type of the through silicon via is limited by the distance. Moreover, through cutting the wafer by the cutter, the strength and reliability of the chip package are reduced, and the electric leakage of the chip package is prone to occur.

SUMMARY

An aspect of the present invention is to provide a chip package.

According to an embodiment of the present invention, a chip package includes a light transmissive substrate, a chip, and a dam element. The chip has a conductive pad, a hollow region, a trench, a first surface, and a second surface that faces away from the first surface. The conductive pad is located on the first surface and exposed through the hollow region, and the hollow region is at one side of the trench and selectively communicated with the trench. The dam element between the light transmissive substrate and the first surface of the chip and covers the hollow region and the trench.

In one embodiment of the present invention, when the hollow region is not communicated with the trench, the chip has at least one sidewall that surrounds the hollow region.

In one embodiment of the present invention, the top view shape of the sidewall includes square, elongated, circular, elliptical, or a combination thereof.

In one embodiment of the present invention, the height of the sidewall is smaller than or equal to a distance that is between the first and second surfaces.

In one embodiment of the present invention, when the hollow region is communicated with the trench, the chip has at least one sidewall that faces the hollow region. The top view shape of the sidewall includes U-shaped, semicircular, semi-elliptical, or a combination thereof. The hollow region has an opening that faces the trench.

In one embodiment of the present invention, the chip package further includes an isolation layer. The isolation layer is located on the second surface of the chip and the sidewall of the chip facing the hollow region.

In one embodiment of the present invention, the chip package further includes a redistribution layer. The redistribution layer is located on the isolation layer and electrically connected to the conductive pad.

In one embodiment of the present invention, the chip package further includes a protection layer. The protection layer is located on the redistribution layer and in the hollow region and the trench.

In one embodiment of the present invention, the protection layer has an opening, and the redistribution layer is exposed through the opening. The chip package further includes a conductive protrusion. The conductive protrusion is located on the redistribution layer that is in the opening of the protection layer.

Another aspect of the present invention is to provide a manufacturing method of a chip package.

According to an embodiment of the present invention, a manufacturing method of a chip package includes the following steps. (a) A light transmissive substrate is bonded to a first surface of a wafer, such that a dam element between the light transmissive substrate and the wafer covers a conductive pad of the wafer. (b) A second surface of the wafer facing away from the first surface is etched, such that a hollow region and a trench that is selectively communicated with the hollow region are synchronously formed in the wafer. (c) A first isolation layer on the conductive pad is etched to expose the conductive pad through the hollow region.

In one embodiment of the present invention, when the hollow region is not communicated with the trench, step (b) includes forming at least one sidewall of the wafer surrounding the hollow region, and the top view shape of the sidewall includes square, elongated, circular, elliptical, or a combination thereof.

In one embodiment of the present invention, step (b) includes forming the sidewall with a height that is smaller than or equal to a distance that is between the first and second surfaces.

In one embodiment of the present invention, when the hollow region is communicated with the trench, step (b) includes forming at least one sidewall of the wafer facing the hollow region, and the top view shape of the sidewall includes U-shaped, semicircular, semi-elliptical, or a combination thereof, and the hollow region has an opening that faces the trench.

In one embodiment of the present invention, the manufacturing method further includes forming a second isolation layer on the second surface of the wafer and a sidewall of the wafer facing the hollow region.

In one embodiment of the present invention, the manufacturing method further includes forming a redistribution layer on the second isolation layer and the conductive pad.

In one embodiment of the present invention, the manufacturing method further includes forming a protection layer on the redistribution layer and in the hollow region and the trench.

In one embodiment of the present invention, the manufacturing method further includes forming an opening in the protection layer and forming a conductive protrusion on the redistribution layer that is in the opening of the protection layer.

In one embodiment of the present invention, the manufacturing method further includes cutting the protection layer, the dam element, and the light transmissive substrate in a vertical direction, thereby forming a plurality of chip packages.

In the aforementioned embodiments of the present invention, etching synchronously forms the hollow region and the trench of the wafer, and thus the trench may be selectively communicated with the hollow region through process control. As a result, a distance between the hollow region and the trench may be reduced, and the hollow region may have different types of variation through an etching process. Moreover, since a cutter does not cut the wafer, the strength and reliability of the chip package may be improved, and the electric leakage of the chip package does not easily occur.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
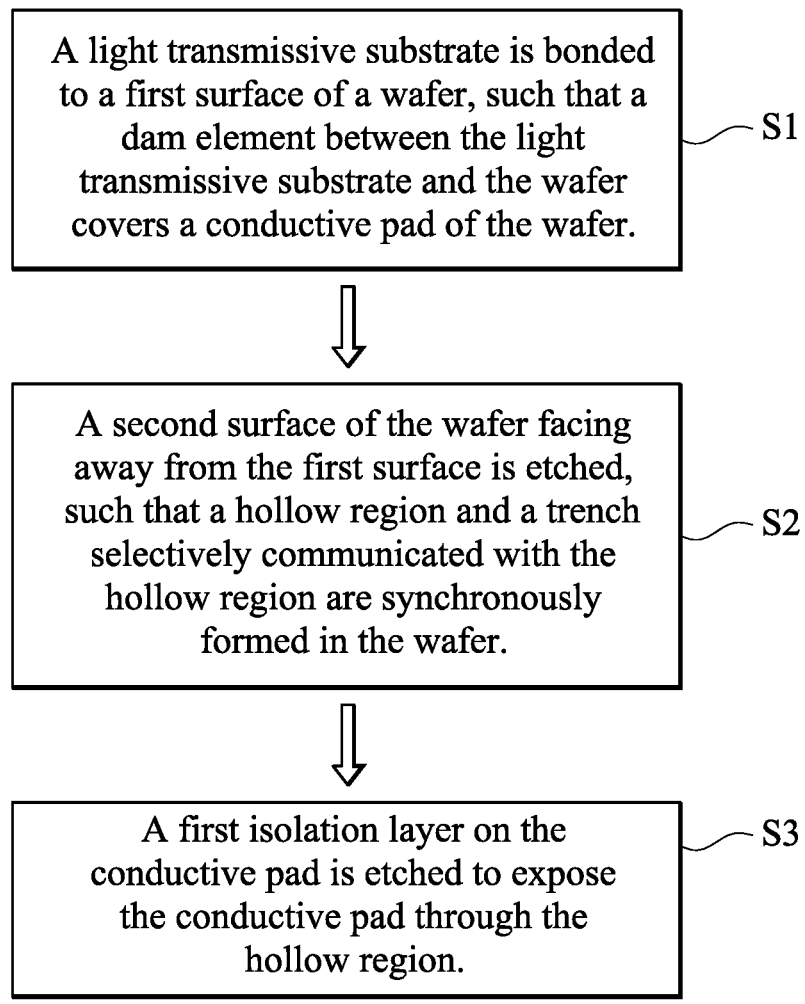
FIG. 1 is a flow chart of a manufacturing method of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a manufacturing method of a chip package according to one embodiment of the present invention. In step S1, a light transmissive substrate is bonded to a first surface of a wafer, such that a dam element between the light transmissive substrate and the wafer covers a conductive pad of the wafer. Thereafter in step S2, a second surface of the wafer facing away from the first surface is etched, such that a hollow region and a trench that is selectively communicated with the hollow region are synchronously formed in the wafer. Subsequently in step S3, a first isolation layer on the conductive pad is etched to expose the conductive pad through the hollow region. In the following description, the aforesaid steps of the manufacturing method of the chip package will be described.

Figure 2:
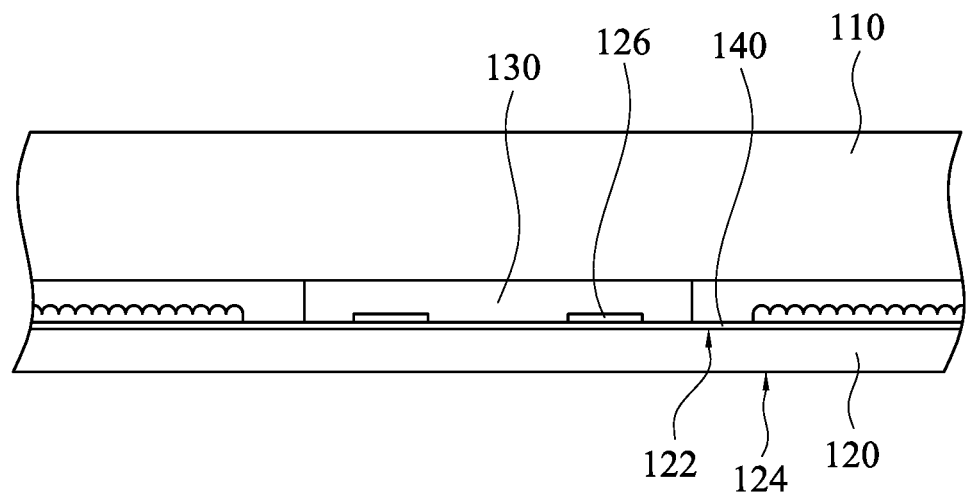
FIG. 2 is a cross-sectional view of a light transmissive substrate after being bonded to a wafer according to one embodiment of the present invention.

FIG. 2 is a cross-sectional view of a light transmissive substrate 110 after being bonded to a wafer 120 according to one embodiment of the present invention. The light transmissive substrate 110 may be bonded to a first surface 122 of the wafer 120, such that a dam element 130 between the light transmissive substrate 110 and the wafer 120 covers a conductive pad 126 of the wafer 120. Before the light transmissive substrate 110 is bonded to the wafer 120, the dam element 130 may be disposed on the light transmissive substrate 110 or the wafer 120 as deemed necessary by designers. In this embodiment, the wafer 120 may be made of a material including silicon, such as a silicon wafer, which is not yet diced to form plural chips by a cutting process. Image sensors may be manufactured from the wafer 120. The conductive pad 126 may be made of a material including aluminum. The light transmissive substrate 110 may be made of a material including glass, plastic, or acrylic. However, the present invention is not limited to the aforementioned materials.

Figure 3:
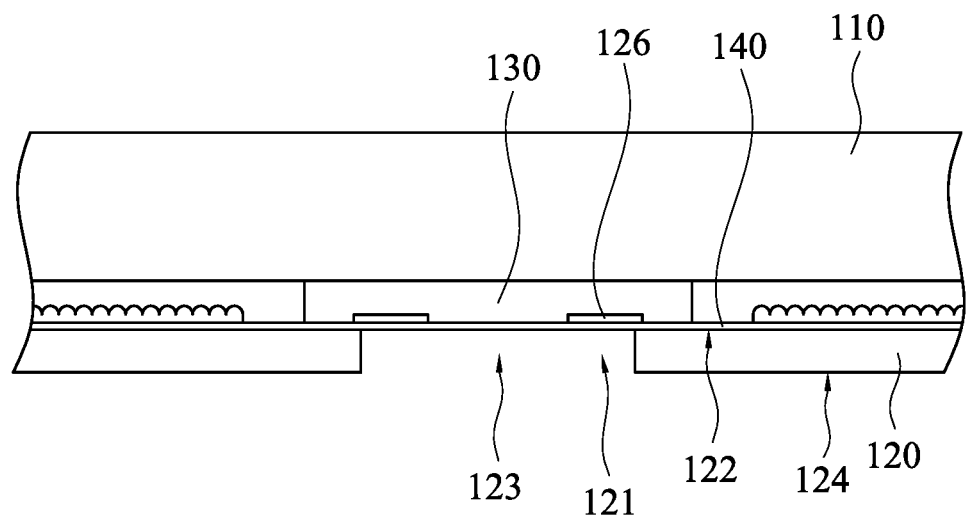
FIG. 3 is a cross-sectional view of a hollow region and a trench that is communicated with the hollow region after being formed in the wafer shown in FIG. 2.
Figure 6:
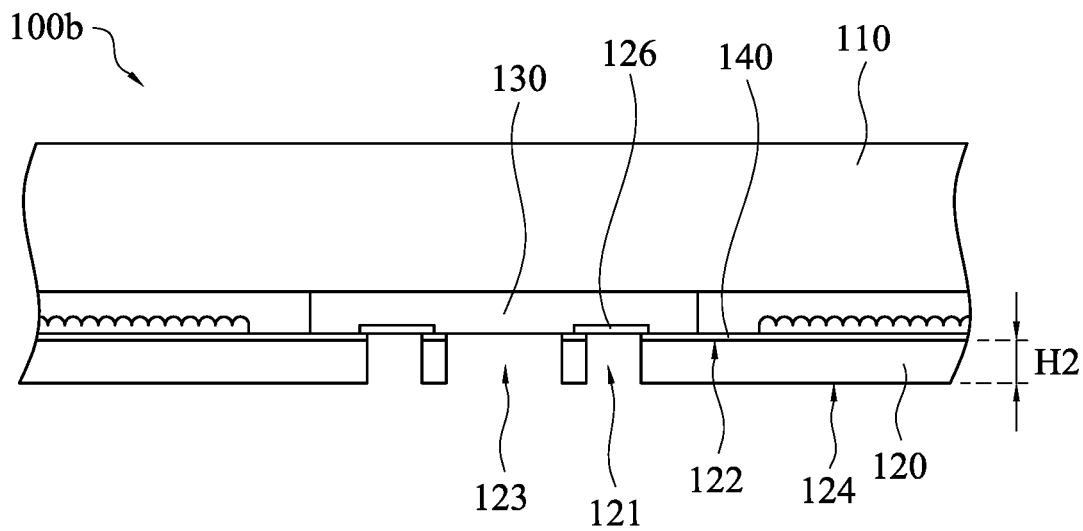
FIG. 6 is another embodiment of FIG. 4.

FIG. 3 is a cross-sectional view of a hollow region 121 and a trench 123 that is communicated with the hollow region 121 after being formed in the wafer 120 shown in FIG. 2. As shown in FIG. 2 and FIG. 3, after the light transmissive substrate 110 is bonded to the wafer 120, a second surface 124 of the wafer 120 facing away from the first surface 122 may be etched, such that the hollow region 121 and the trench 123 that is selectively communicated with the hollow region 121 are synchronously formed in the wafer 120. The hollow region 121 of the wafer 120 is referred to as a region that can expose the conductive pad 126, such as a region under the conductive pad 126 shown in FIG. 3. The trench 123 of the wafer 120 is referred to as a region that can be cut by a cutter in a subsequent cutting (dicing) process. In this embodiment, the hollow region 121 is communicated with the trench 123, but in another embodiment, the hollow region 121 may be not communicated with the trench 123, is separated from the trench 123, as shown in FIG. 6.

Figure 4:
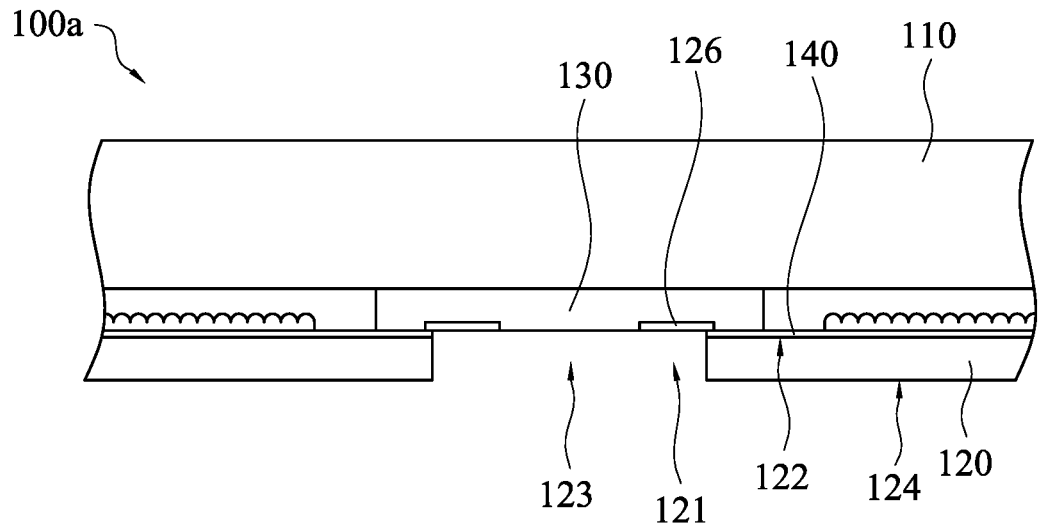
FIG. 4 is a cross-sectional view of a first isolation layer on a conductive pad after being etched shown in FIG. 3.

FIG. 4 is a cross-sectional view of a first isolation layer 140 on the conductive pad 126 after being etched shown in FIG. 3. As shown in FIG. 3 and FIG. 4, after the hollow region 121 and the trench 123 that is communicated with the hollow region 121 are formed in the wafer 120, the first isolation layer 140 on the conductive pad 126 may be etched, such that the conductive pad 126 is exposed through the hollow region 121. As a result, a semiconductor structure 100a may be obtained. The semiconductor structure 100a includes the light transmissive substrate 110, the wafer 120, and the dam element 130. The wafer 120 has the conductive pad 126, the hollow region 121, the trench 123, the first surface 122, and the second surface 124 that faces away from the first surface 122. The conductive pad 126 is located on the first surface 122 and exposed through the hollow region 121. The hollow region 121 is at one side of the trench 123 and selectively communicated with the trench 123. The dam element 130 is between the light transmissive substrate 110 and the first surface 122 of the wafer 120 and covers the hollow region 121 and the trench 123.

Figure 5:
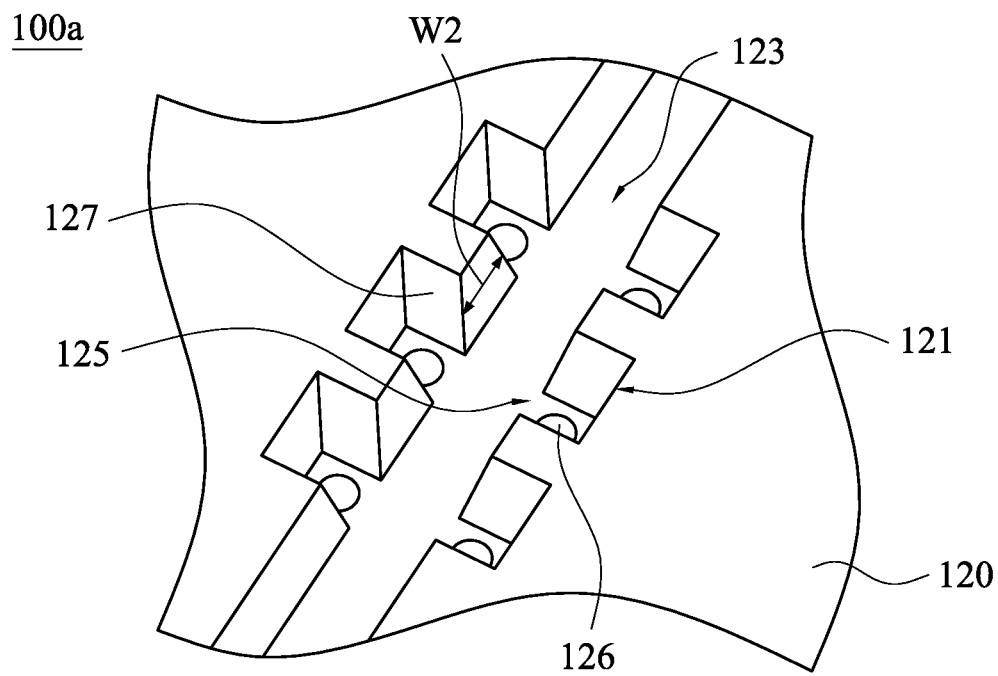
FIG. 5 is a perspective view of a semiconductor structure shown in FIG. 4, in which the perspective view is from a second surface of the wafer.

FIG. 5 is a perspective view of the semiconductor structure 100a shown in FIG. 4, in which the perspective view is from the second surface 124 of the wafer 120. As shown in FIG. 4 and FIG. 5, when the wafer 120 is etched to form the hollow region 121 and the trench 123 that is communicated with the hollow region 121, at least one sidewall 127 of the wafer 120 facing the hollow region 121 may be formed. The top view shape of the sidewall 127 includes U-shaped, semicircular, semi-elliptical, or a combination thereof. In this embodiment, the top view shape of the sidewall 127 is U-shaped. The hollow region 121 has an opening 125 that faces the trench 123, such that the position of the conductive pad 126 can be adjacent to the trench 123. Hence, the miniaturizing design of the semiconductor structure 100a may be improved.

Since etching synchronously forms the hollow region 121 and the trench 123 of the wafer 120, the trench 123 may be selectively communicated with the hollow region 121 through process control. As a result, a distance between the hollow region 121 and the trench 123 may be reduced, and the hollow region 121 may have different types of variation through an etching process. Moreover, due to the reduced distance between the hollow region 121 and the trench 123, space of the wafer 120 for designing lines outside of the hollow region 121 and the trench 123 may be increased, such that the layout of the lines is in a significantly adjustable manner.

Figure 7:
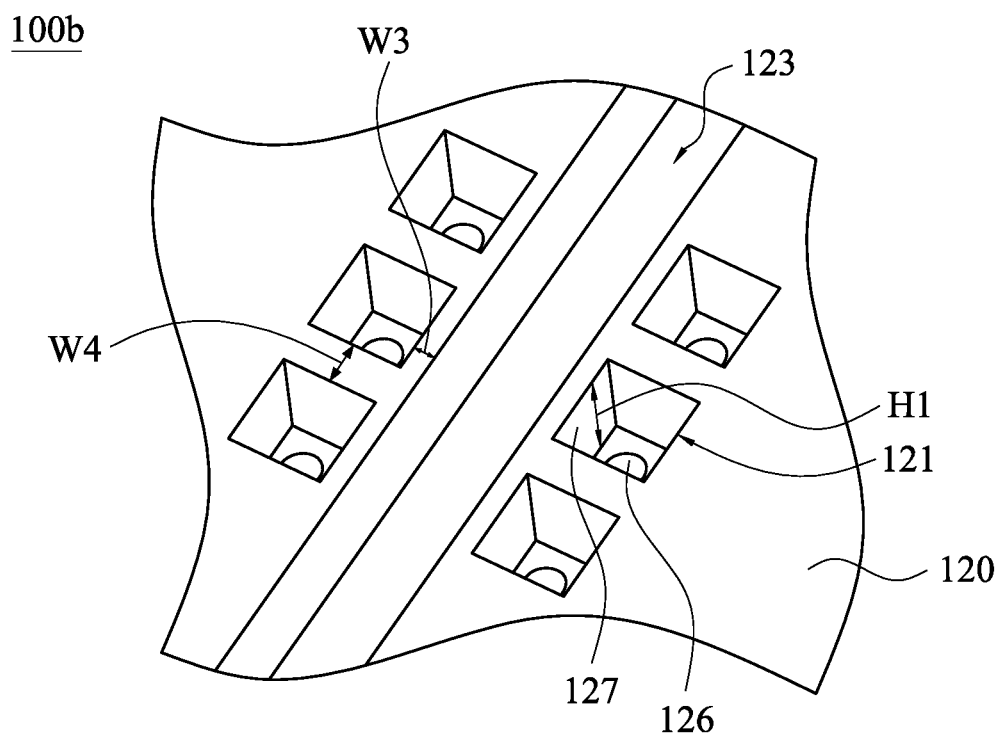
FIG. 7 is a perspective view of a semiconductor structure shown in FIG. 6, in which the perspective view is from the second surface of the wafer.

FIG. 6 is another embodiment of FIG. 4. FIG. 7 is a perspective view of a semiconductor structure 100b shown in FIG. 6, in which the perspective view is from the second surface 124 of the wafer 120. As shown in FIG. 6 and FIG. 7, the semiconductor structure 100b includes the light transmissive substrate 110, the wafer 120, and the dam element 130. The difference between this embodiment and the embodiment shown in FIGS. 4 and 5 is that the hollow region 121 is not communicated with the trench 123. When the wafer 120 is etched to form the hollow region 121 and the trench 123 that is not communicated with the hollow region 121, at least one sidewall 127 of the wafer 120 surrounding the hollow region 121 may be formed, and the top view shape of the sidewall 127 may include square, elongated, circular, elliptical, or a combination thereof. In this embodiment, the top view shape of the sidewall 127 is square, and the height H1 of the sidewall 127 is substantially equal to the distance H2 that is between the first and second surfaces 122, 124.

Since subsequent processes for the semiconductor structure 100a of FIG. 4 are similar to that for the semiconductor structure 100b of FIG. 6, only the semiconductor structure 100a of FIG. 4 is used as an example to describe in the following description.

Figure 8:
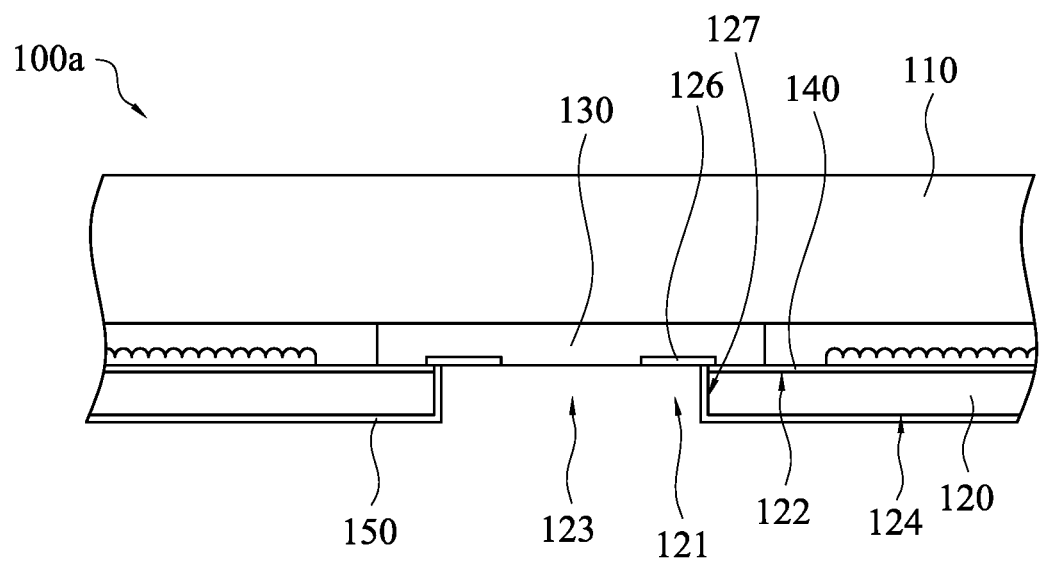
FIG. 8 is a cross-sectional view of a second isolation layer after being formed on the wafer shown in FIG. 4.

FIG. 8 is a cross-sectional view of a second isolation layer 150 after being formed on the wafer 120 shown in FIG. 4. As shown in FIG. 4 and FIG. 8, after the conductive pad 126 is exposed through the hollow region 121, the second isolation layer 150 may be formed on the second surface 124 of the wafer 120 and the sidewall 127 of the wafer 120 facing the hollow region 121.

Figure 9:
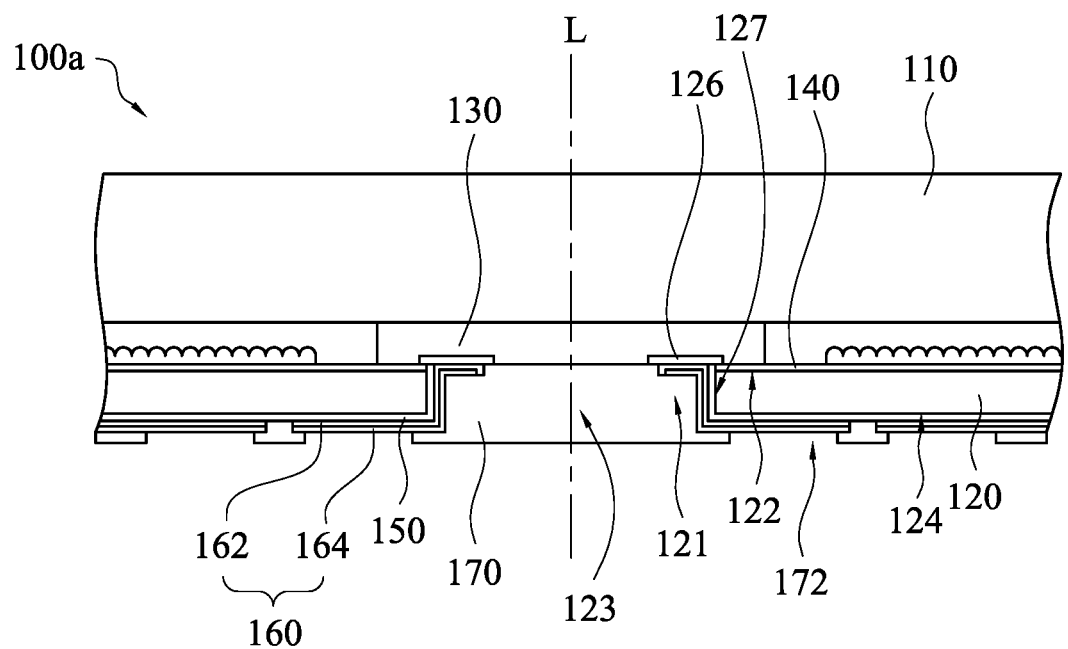
FIG. 9 is a cross-sectional view of a redistribution layer and a protection layer after being formed on the second isolation layer and the conductive pad shown in FIG. 8.

FIG. 9 is a cross-sectional view of a redistribution layer 160 and a protection layer 170 after being formed on the second isolation layer 150 and the conductive pad 126 shown in FIG. 8. As shown in FIG. 8 and FIG. 9, after the second isolation layer 150 is formed on the wafer 120, the redistribution layer 160 may be formed on the second isolation layer 150 and the conductive pad 126, such that the redistribution layer 160 is electrically connected to the conductive pad 126. The redistribution layer 160 may include metal layers 162, 164. When the metal layer 162 is aluminum, the metal layer 164 may be gold. Alternatively, when the metal layer 162 is titanium, the metal layer 164 may be copper. Sputtering may be used to form titanium, and electroplating may be used to form copper. After the redistribution layer 160 is formed on the second isolation layer 150 and the conductive pad 126, the protection layer 170 may be formed on the redistribution layer 160 and in the hollow region 121 and the trench 123. Thereafter, the protection layer 170 may be patterned to form an opening 172, such that the redistribution layer 160 is exposed through the opening 172 of the protection layer 170.

Figure 10:
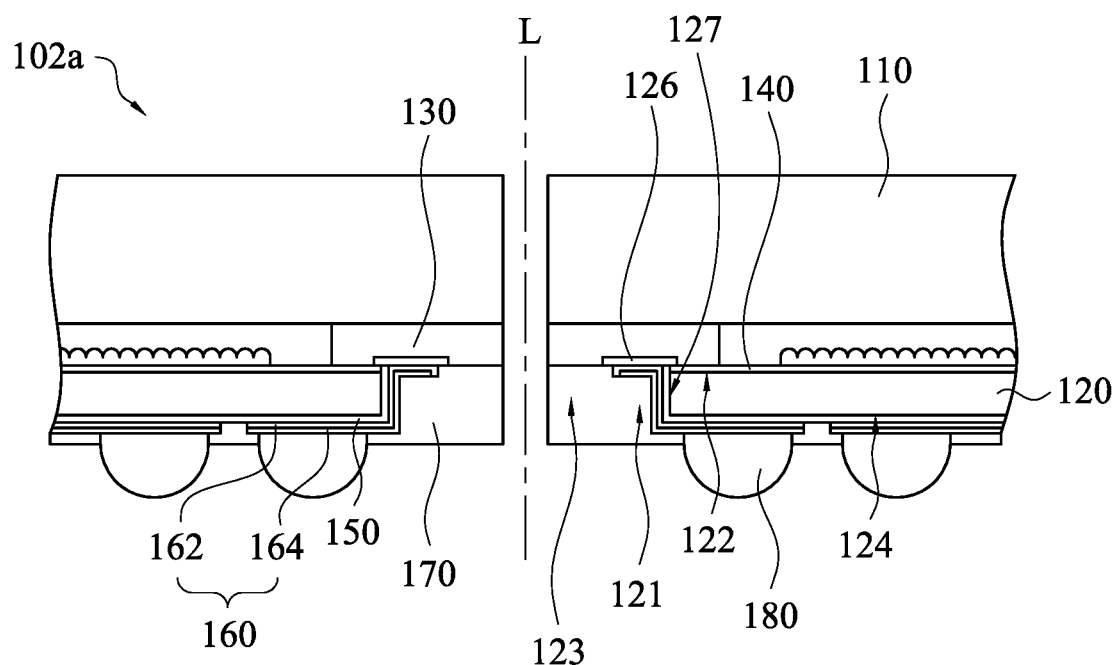
FIG. 10 is a cross-sectional view of a conductive protrusion after being formed on the redistribution layer shown in FIG. 9.

FIG. 10 is a cross-sectional view of a conductive protrusion 180 after being formed on the redistribution layer 160 shown in FIG. 9. As shown in FIG. 9 and FIG. 10, after the opening 172 is formed in the protection layer 170, the conductive protrusion 180 may be formed on the redistribution layer 160 that is in the opening 172 of the protection layer 170, such that the conductive protrusion 180 may be electrically connected to the conductive pad 126 through the redistribution layer 160. The conductive protrusion 180 may be solder ball, and the present invention is not limited to the shape and material of the conductive protrusion 180.

After the conductive protrusion 180 is formed on the redistribution layer 160, the protection layer 170, the dam element 130, and the light transmissive substrate 110 may be cut in a vertical direction along the trench 123 (i.e., along line L), such that the semiconductor structure 100a of FIG. 9 is divided to form plural chip packages 102a. The chip package 102a may be an image sensing chip, such as a CMOS element, but the present invention is not limited in this regard. Since a cutter does not cut the wafer 120, the strength and reliability of the chip package 102a may be improved, and the electric leakage of the chip package 102a does not easily occur.

The chip package 102a is a portion of the semiconductor structure 100a after the semiconductor structure 100a is cut, so that the chip package 102a has the same structure as the semiconductor structure 100a. The chip package 102a includes the light transmissive substrate 110, the chip 120, and the dam element 130. The chip 120 is referred to as a piece of the wafer 120 of FIG. 9 after being divided. The chip 120 has the conductive pad 126, the hollow region 121, the trench 123, the first surface 122, and the second surface 124 that faces away from the first surface 122. The conductive pad 126 is located on the first surface 122 and exposed through the hollow region 121. The hollow region 121 is at one side of the trench 123 and selectively communicated with the trench 123. The dam element 130 is between the light transmissive substrate 110 and the first surface 122 of the chip 120 and covers the hollow region 121 and the trench 123. In this embodiment, the hollow region 121 is communicated with the trench 123.

Furthermore, the second isolation layer 150, the redistribution layer 160, the protection layer 170, and the conductive protrusion 180 may also be formed on the semiconductor structure 100b of FIG. 6. That is to say, in the structure of FIG. 9, the semiconductor structure 100a of FIG. 4 may be replaced by the semiconductor structure 100b of FIG. 6. After the dam element 130 and the light transmissive substrate 110 are cut along the trench 123, another chip package of another embodiment may be obtained, and the hollow region 121 is not communicated with the trench 123 in such chip package.

It is to be noted that the connection relationships and materials of the elements described above will not be repeated in the following description, and only aspects related to other types of semiconductor structures will be described. Since plural chip packages may be formed by cutting a semiconductor structure along the trench, each of the semiconductor structures shown in FIGS. 5, 7, 11A to 11C, and 12A to 12D may be referred to as at least two chip packages that are connected with each other. That is to say, each of the chip packages has the same structure as the corresponding semiconductor structure, and the chip of each of the chip packages also has the same structure as the wafer of the corresponding semiconductor structure.

Figure 11A:
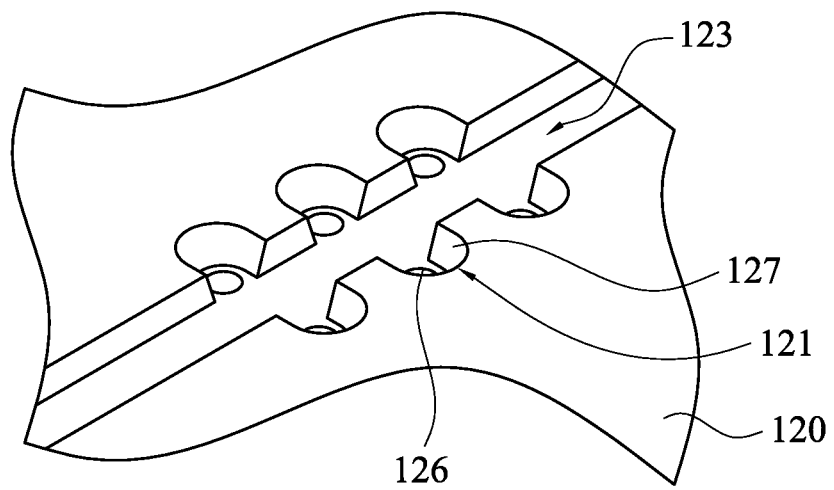
FIGS. 11A to 11C are other embodiments of the semiconductor structure shown in FIG. 5.
Figure 11B:
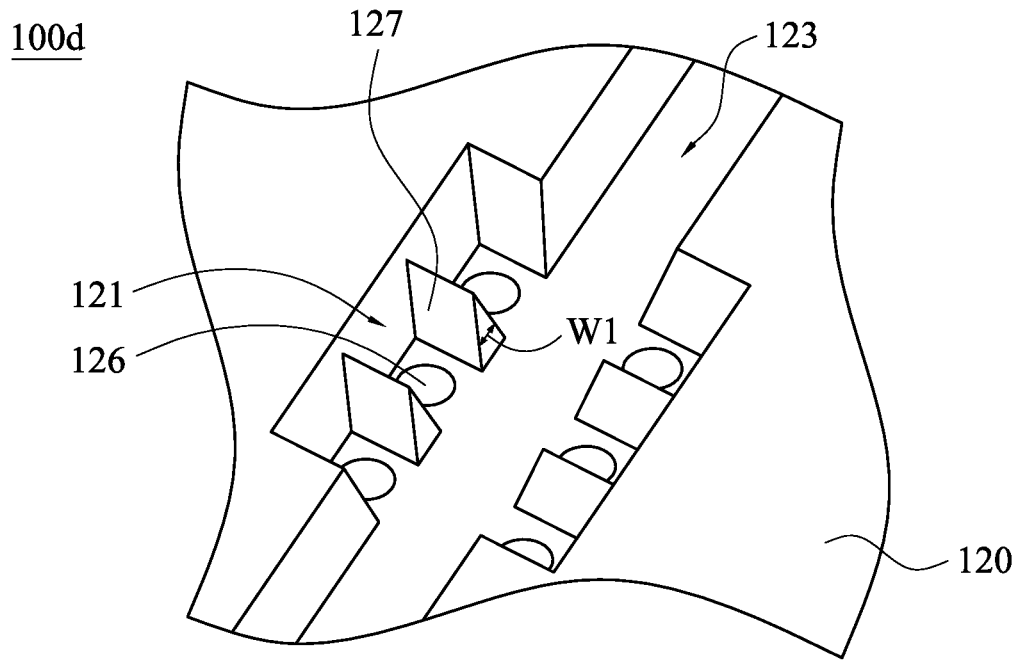
Figure 11C:
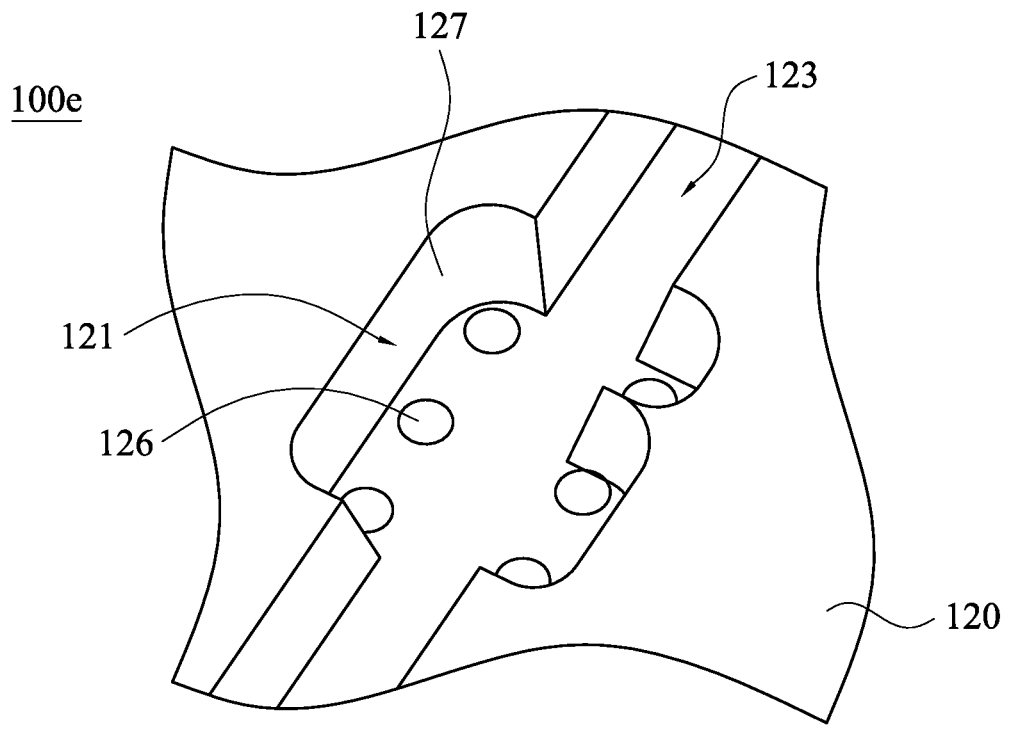

FIGS. 11A to 11C are other embodiments of the semiconductor structure 100*a* shown in FIG. 5. The difference between a semiconductor structure 100*c* of FIG. 11A and the semiconductor structure 100*a* of FIG. 5 is that the top view shape of the sidewall 127 of the wafer 120 facing the hollow region 121 show in FIG. 11A is semicircular.

The difference between a semiconductor structure 100*d* of FIG. 11B and the semiconductor structure 100*a* of FIG. 5 is that the width W1 of the sidewall 127 between two adjacent hollow regions 121 show in FIG. 11B is smaller than the width W2 of the sidewall 127 between two adjacent hollow regions 121 show in FIG. 5. Hence, two adjacent conductive pads 126 of FIG. 11B are closer, such that the density of lines may be improved.

The difference between a semiconductor structure 100*e* of FIG. 11C and the semiconductor structure 100*a* of FIG. 5 is that the top view shape of the sidewall 127 of the wafer 120 facing the hollow region 121 show in FIG. 11C includes semicircular and semi-elliptical. In this embodiment, the sidewall 127 at the right side of the trench 123 can separate the conductive pads 126 that are used to sending different signals.

Figure 12A:
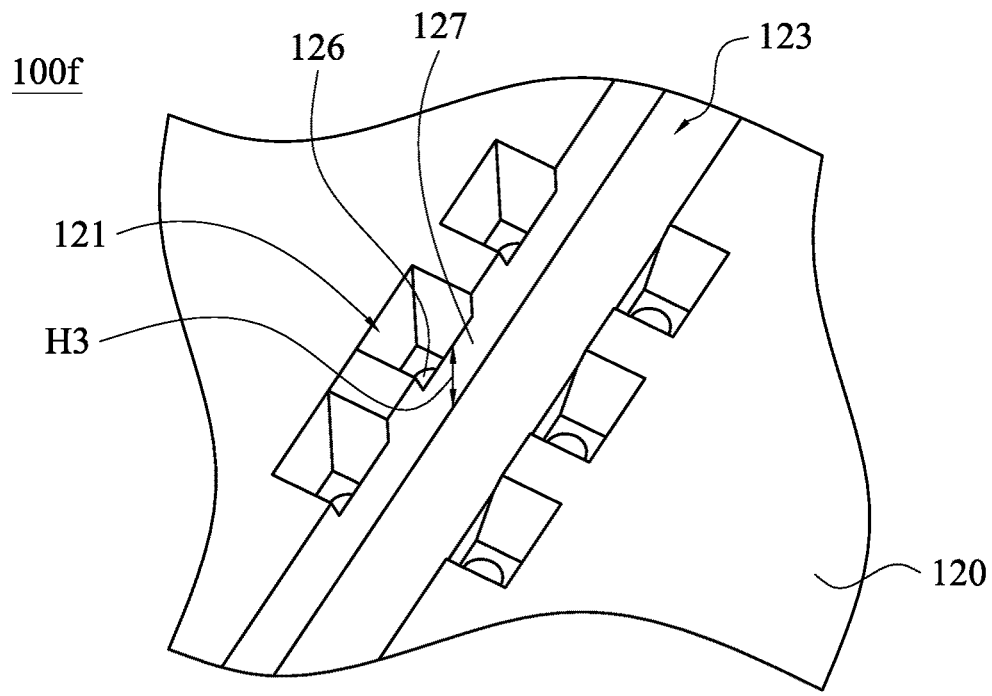
FIGS. 12A to 12D are other embodiments of the semiconductor structure shown in FIG. 7.

FIGS. 12A to 12D are other embodiments of the semiconductor structure 100*b* shown in FIG. 7. The difference between a semiconductor structure 100*f* of FIG. 12A and the semiconductor structure 100*b* of FIG. 7 is that the height H3 of the sidewall 127 of the wafer 120 of FIG. 12A is smaller than the height H1 of the sidewall 127 of the wafer 120 of FIG. 7 (i.e., the distance H2 between the first and second surfaces 122, 124 shown in FIG. 6). Moreover, the width between the hollow region 121 and the trench 123 shown in FIG. 12A is smaller than the width W3 between the hollow region 121 and the trench 123 shown in FIG. 7, such that the position of the conductive pad 126 of FIG. 12A can be more adjacent to the trench 123, and space of the wafer 120 for designing lines may be increased.

Figure 12B:
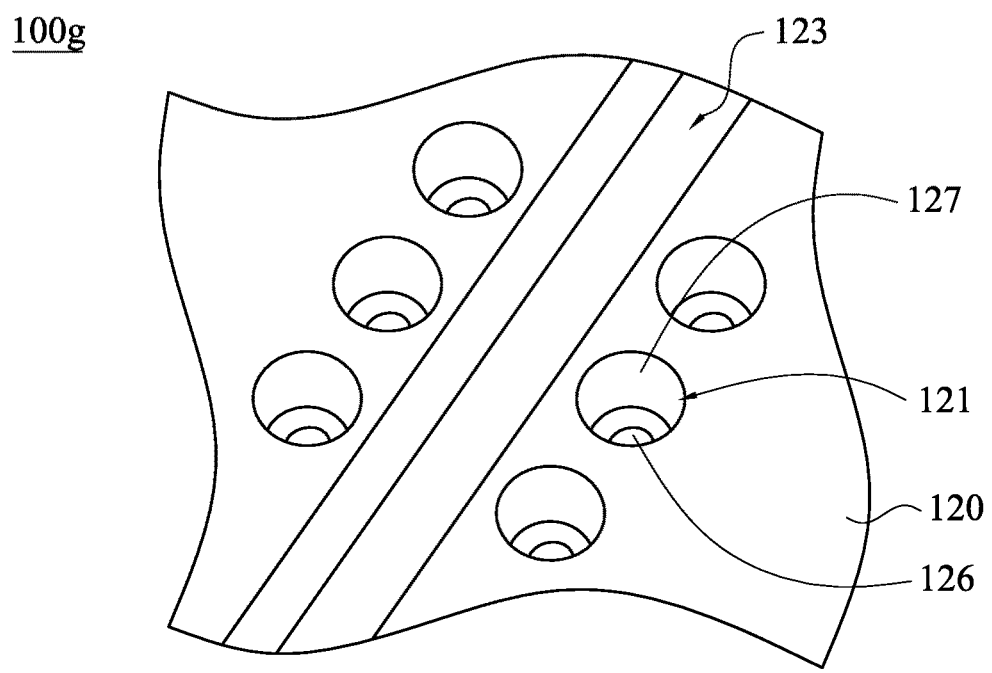

The difference between a semiconductor structure 100*g* of FIG. 12B and the semiconductor structure 100*b* of FIG. 7 is that the top view shape of the sidewall 127 of the wafer 120 facing the hollow region 121 show in FIG. 11B is circular.

Figure 12C:
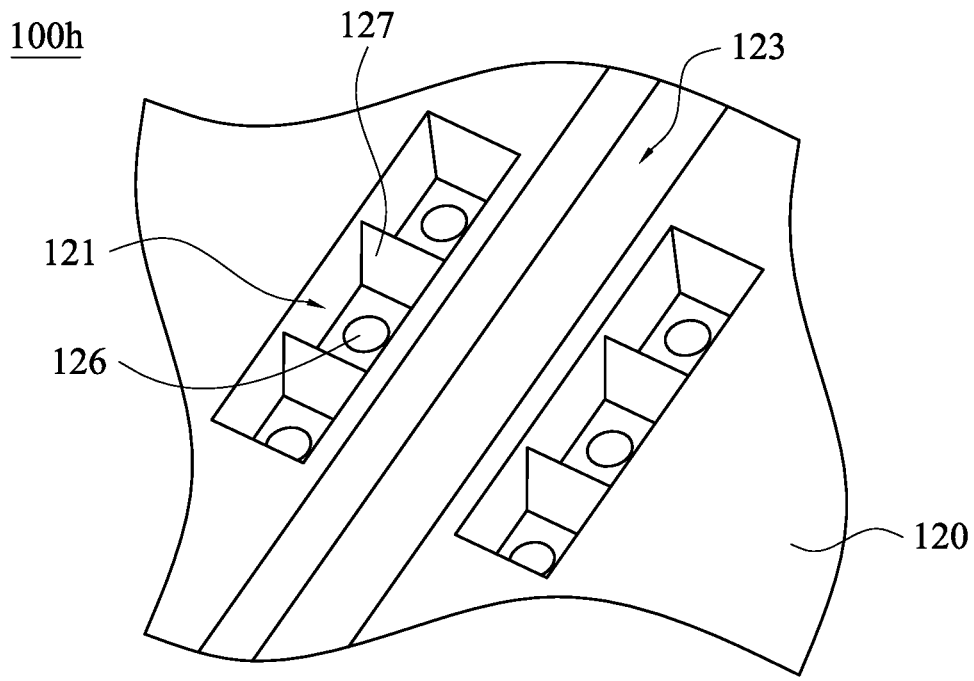

The difference between a semiconductor structure 100*h* of FIG. 12C and the semiconductor structure 100*b* of FIG. 7 is that the width W1 of the sidewall 127 between two adjacent hollow regions 121 show in FIG. 12C is smaller than the width W4 of the sidewall 127 between two adjacent hollow regions 121 show in FIG. 7. Hence, two adjacent conductive pads 126 of FIG. 12C are closer, such that the density of lines may be improved.

Figure 12D:
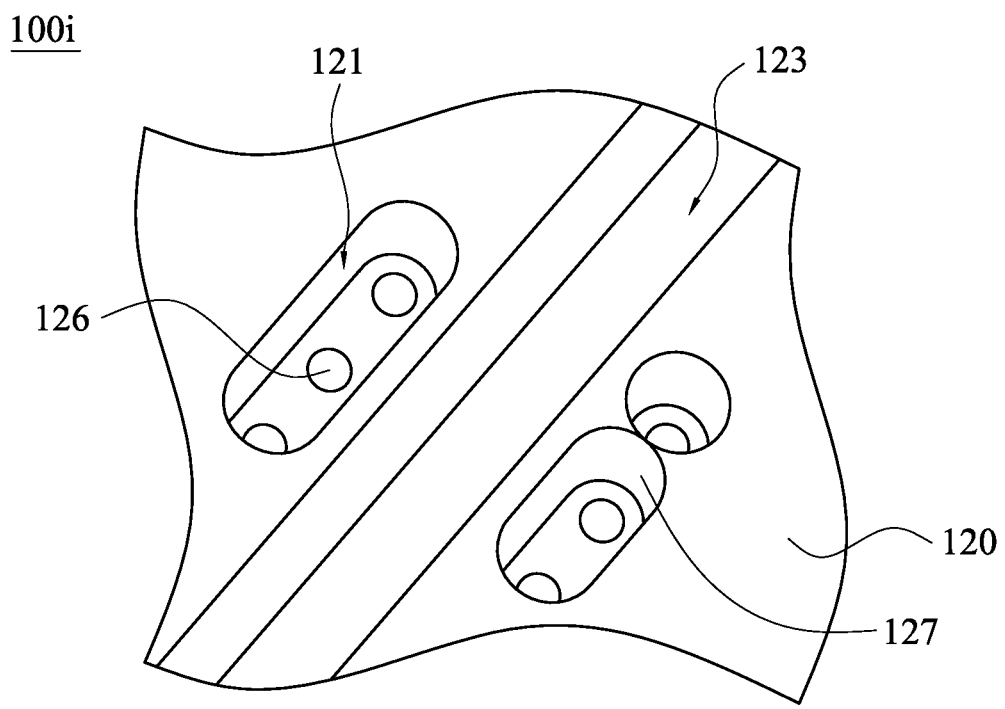

The difference between a semiconductor structure 100*i* of FIG. 12D and the semiconductor structure 100*b* of FIG. 7 is that the top view shape of the sidewall 127 of the wafer 120 facing the hollow region 121 show in FIG. 12D includes circular and elliptical. In this embodiment, the sidewall 127 at the right side of the trench 123 can separate the conductive pads 126 that are used to sending different signals.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
    a light transmissive substrate;
    a chip having a conductive pad, a hollow region, a trench, a first surface, and a second surface that faces away from the first surface, wherein the conductive pad is located on the first surface and exposed through the hollow region, and the hollow region is at one side of the trench and selectively communicated with the trench; and
    a dam element between the light transmissive substrate and the first surface of the chip and covering both of the hollow region and the trench, wherein the dam element has a top surface and a bottom surface respectively located on the light transmissive substrate and the first surface of the chip, and the dam element overlaps the entire conductive pad and is in contact with a top surface of the conductive pad, and the dam element is between the top surface of the conductive pad and the light transmissive substrate;
    a redistribution layer on the conductive pad; and
    a protection layer located on the redistribution layer and in the hollow region and the trench, wherein the protection layer is in direct contact with an edge of the conductive pad and the dam element.

2. The chip package of claim 1, wherein when the hollow region is not communicated with the trench, the chip has at least one sidewall that surrounds the hollow region.

3. The chip package of claim 2, wherein a top view shape of the sidewall comprises square, elongated, circular, elliptical, or a combination thereof.

4. The chip package of claim 2, wherein a height of the sidewall is smaller than or equal to a distance that is between the first and second surfaces.

5. The chip package of claim 1, wherein when the hollow region is communicated with the trench, the chip has at least one sidewall that faces the hollow region, and a top view shape of the sidewall comprises U-shaped, semicircular, semi-elliptical, or a combination thereof, and the hollow region has an opening that faces the trench.

6. The chip package of claim 1, further comprising:
    an isolation layer located on the second surface of the chip and a sidewall of the chip facing the hollow region.

7. The chip package of claim 6, wherein the redistribution layer is located on the isolation layer and electrically connected to the conductive pad.

8. The chip package of claim 1, wherein the protection layer has an opening, and the redistribution layer is exposed through the opening, and the chip package further comprises:
    a conductive protrusion located on the redistribution layer that is in the opening of the protection layer.

9. A manufacturing method of a chip package, comprising:
    (a) bonding a light transmissive substrate to a first surface of a wafer, such that a dam element between the light transmissive substrate and the wafer covers a conductive pad of the wafer, wherein the dam element has a top surface and a bottom surface respectively located on the light transmissive substrate and the first surface of the wafer, and the dam element overlaps the entire conductive pad and is in contact with a top surface of the conductive pad, and the dam element is between the top surface of the conductive pad and the light transmissive substrate, (b) etching a second surface of the wafer facing away from the first surface, such that a hollow region and a trench that is selectively communicated with the hollow region are synchronously formed in the wafer, wherein the dam element covers both of the hollow region and the trench, (c) etching a first isolation layer on the conductive pad for exposing the conductive pad through the hollow region;

(d) forming a redistribution layer on the conductive pad; and (e) forming a protection layer on the redistribution layer and in the hollow region and the trench, wherein the protection layer is in direct contact with an edge of the conductive pad and the dam element.

10. The manufacturing method of the chip package of claim 9, wherein when the hollow region is not communicated with the trench, step (b) comprises:
forming at least one sidewall of the wafer surrounding the hollow region, wherein a top view shape of the sidewall comprises square, elongated, circular, elliptical, or a combination thereof.

11. The manufacturing method of the chip package of claim 10, wherein step (b) comprises:
forming the sidewall with a height that is smaller than or equal to a distance that is between the first and second surfaces.

12. The manufacturing method of the chip package of claim 9, wherein when the hollow region is communicated with the trench, step (b) comprises:
forming at least one sidewall of the wafer facing the hollow region, wherein a top View shape of the sidewall comprises U-shaped, semicircular, semi-elliptical, or a combination thereof, and the hollow region has an opening that faces the trench.

13. The manufacturing method of the chip package of claim 9, further comprising:
forming a second isolation layer on the second surface of the wafer and a sidewall of the wafer facing the hollow region.

14. The manufacturing method of the chip package of claim 13, wherein forming the redistribution layer comprises forming the redistribution layer on the second isolation layer.

15. The manufacturing method of the chip package of claim 9, further comprising:
forming an opening in the protection layer; and
forming a conductive protrusion on the redistribution layer that is in the opening of the protection layer.

16. The manufacturing method of the chip package of claim 9, further comprising:
cutting the protection layer, the dam element, and the light transmissive substrate in a vertical direction, thereby forming a plurality of chip packages.

17. The manufacturing method of the chip package of claim 9, wherein:
the conductive pad is located on the first surface and exposed through the hollow region, and the hollow region is at one side of the trench and selectively communicated with the trench; and
the dam element is between the light transmissive substrate and the first surface of the wafer, and covers the hollow region and the trench.

* * * * *